US007518197B2

(12) United States Patent
Yamaguchi

(10) Patent No.: US 7,518,197 B2
(45) Date of Patent: Apr. 14, 2009

(54) POWER SEMICONDUCTOR DEVICE

(75) Inventor: Masakazu Yamaguchi, Kawasaki (JP)

(73) Assignees: Kabushiki Kaisha Toshiba, Tokyo (JP);
Toyota Jidosha Kabushiki Kaisha,
Toyota-Shi (JP)

( * ) Notice: Subject to any disclaimer, the term of this patent is extended or adjusted under 35 U.S.C. 154(b) by 91 days.

(21) Appl. No.: 11/437,657

(22) Filed: May 22, 2006

(65) Prior Publication Data
US 2006/0278925 A1    Dec. 14, 2006

(30) Foreign Application Priority Data
May 23, 2005    (JP)    ............... 2005-149840

(51) Int. Cl.
*H01L 27/088*    (2006.01)
(52) U.S. Cl. .................. 257/401; 257/329; 257/341; 257/330; 257/492; 257/262
(58) Field of Classification Search .................. 257/492, 257/493, 139, 330, 133, 329, 341, 262, 401
See application file for complete search history.

(56) References Cited
U.S. PATENT DOCUMENTS
5,319,221 A * 6/1994 Ueno ................... 257/135

| 5,923,065 A * | 7/1999 | So et al. ...................... 257/328 |
| 6,040,598 A * | 3/2000 | Nakayama et al. .......... 257/329 |
| 6,566,691 B1 * | 5/2003 | Inoue et al. .................. 257/139 |
| 6,693,338 B2 * | 2/2004 | Saitoh et al. ................. 257/492 |
| 2005/0179083 A1 * | 8/2005 | Ogura et al. ................. 257/341 |

FOREIGN PATENT DOCUMENTS

| JP | 9-264570 | 10/1997 |
| JP | 11-26779 | 1/1999 |
| JP | 11-40822 | 2/1999 |
| JP | 2004-146679 | 5/2004 |

* cited by examiner

*Primary Examiner*—M. Wilczewski
*Assistant Examiner*—Telly D Green
(74) *Attorney, Agent, or Firm*—Oblon, Spivak, McClelland, Maier & Neustadt, P.C.

(57) ABSTRACT

A power semiconductor device has a first base layer of first conductive type, a contact layer of first conductive type formed on a surface of the first base layer, a second base layer of first conductive layer which is formed on the surface of the first base layer at a side opposite to the first contact layer and has an impurity concentration higher than that of the first base layer, a second contact layer of second conductive type formed on the surface of the first base layer or the second base layer, and a junction termination region formed in vicinity of or in contact with outside in a horizontal direction of the second contact layer.

28 Claims, 8 Drawing Sheets

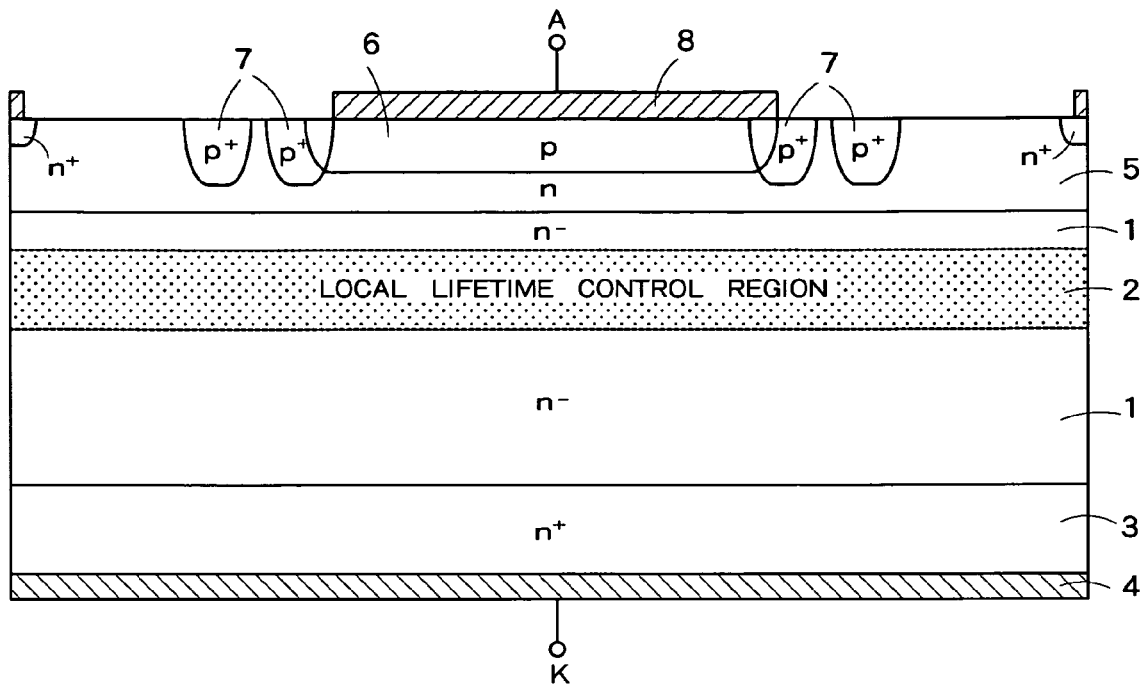
F I G. 1
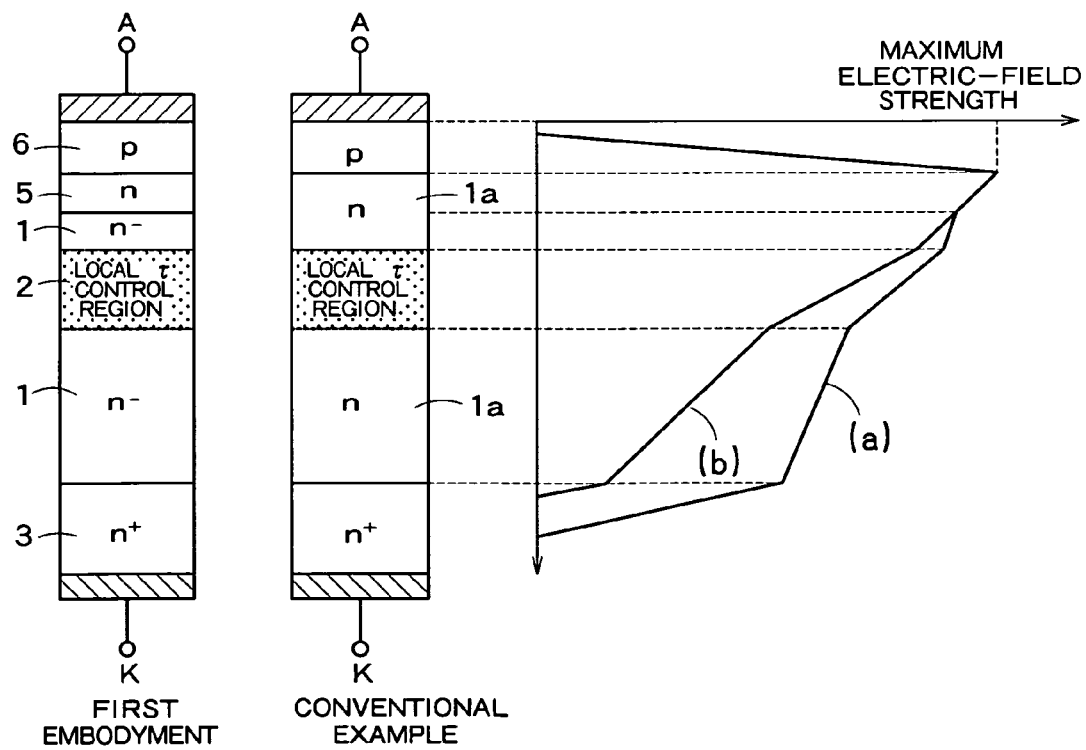
F I G. 2A  F I G. 2B

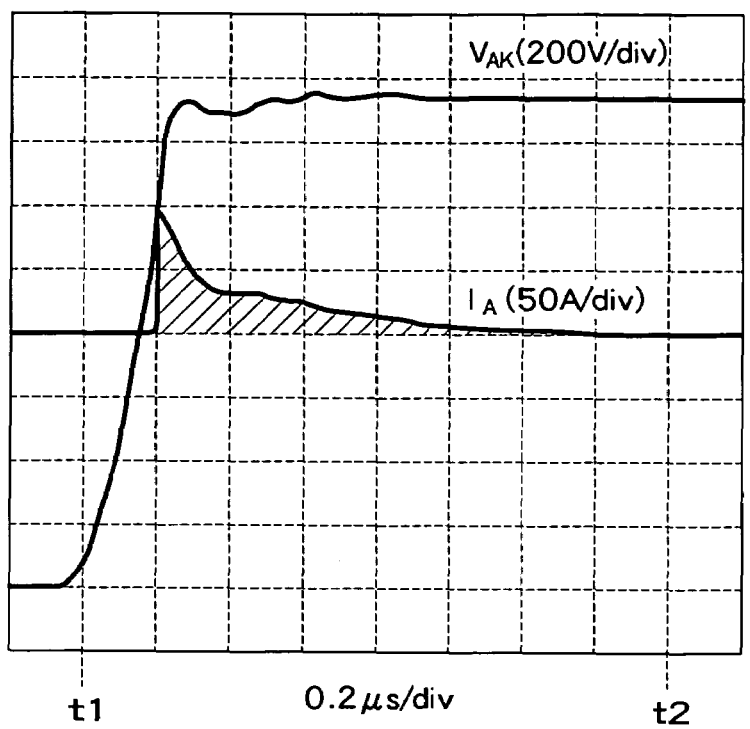
F I G. 3
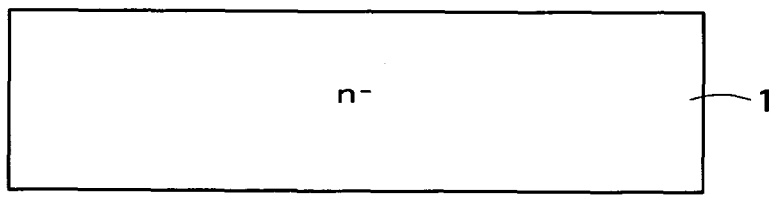
F I G. 4A
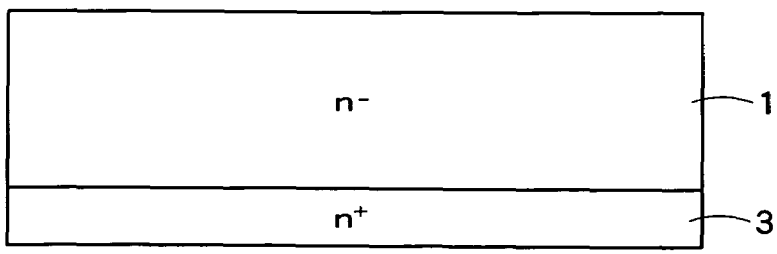
F I G. 4B
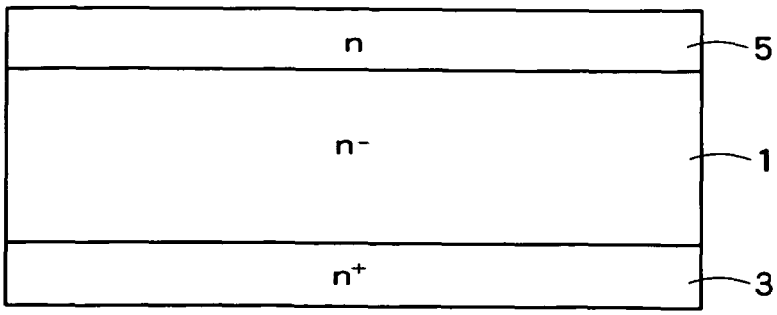
F I G. 4C

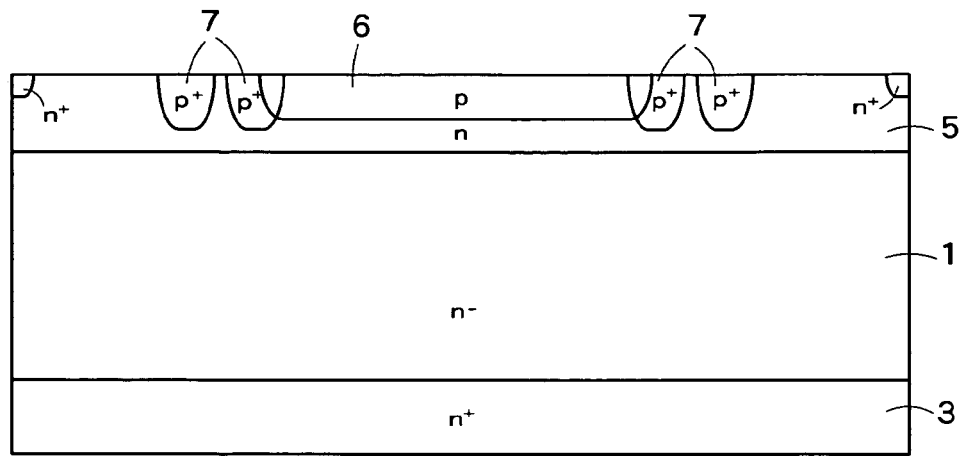
F I G. 5A
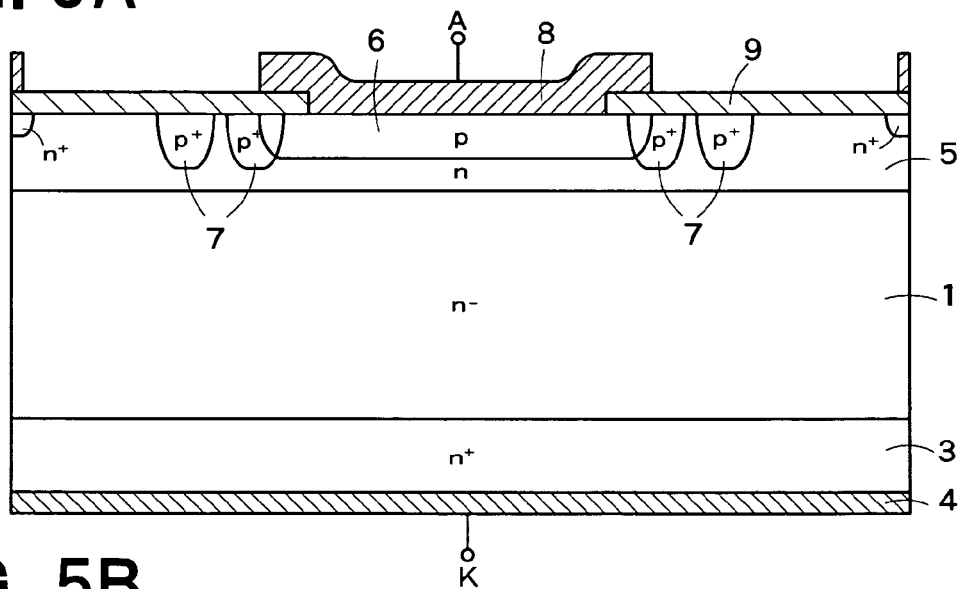
F I G. 5B
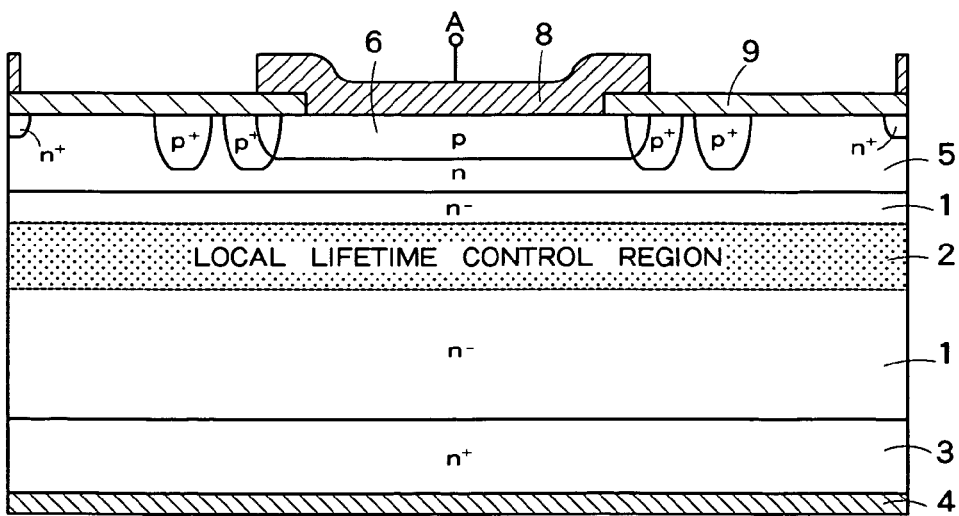
F I G. 5C

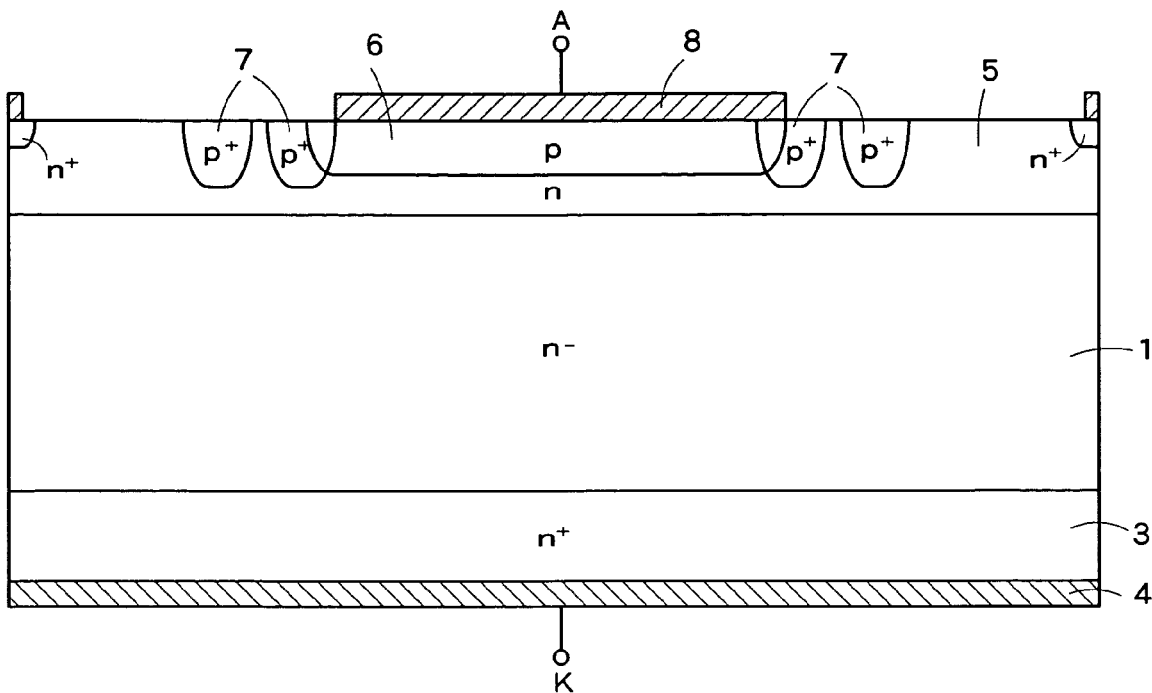
F I G. 8
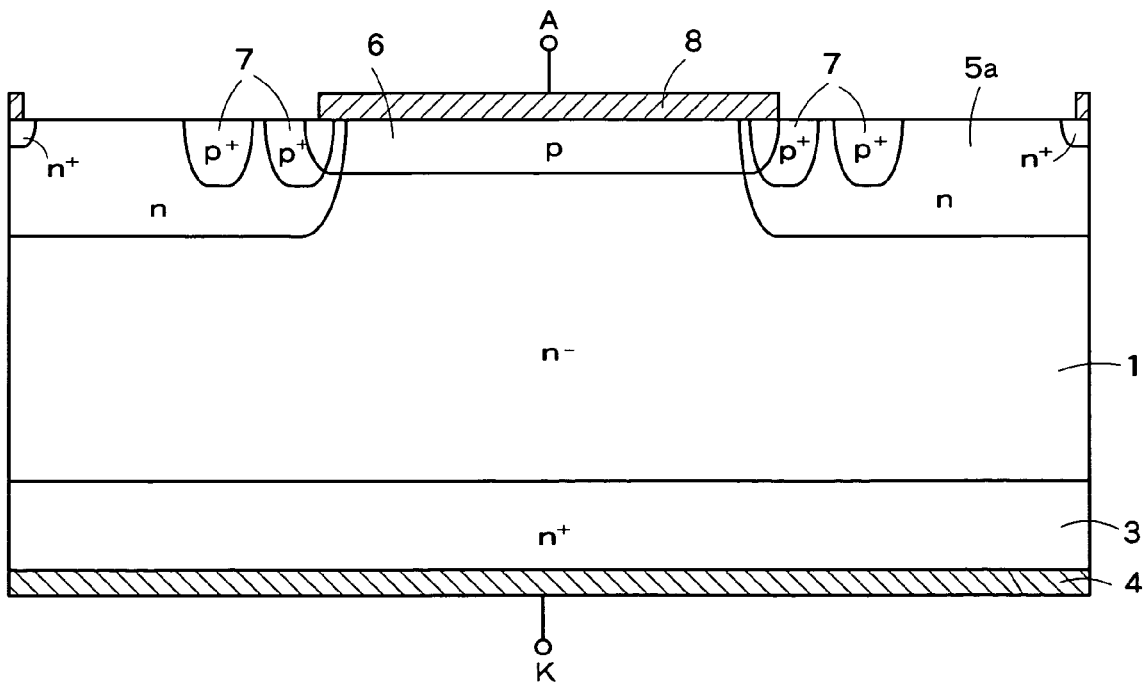
F I G. 9

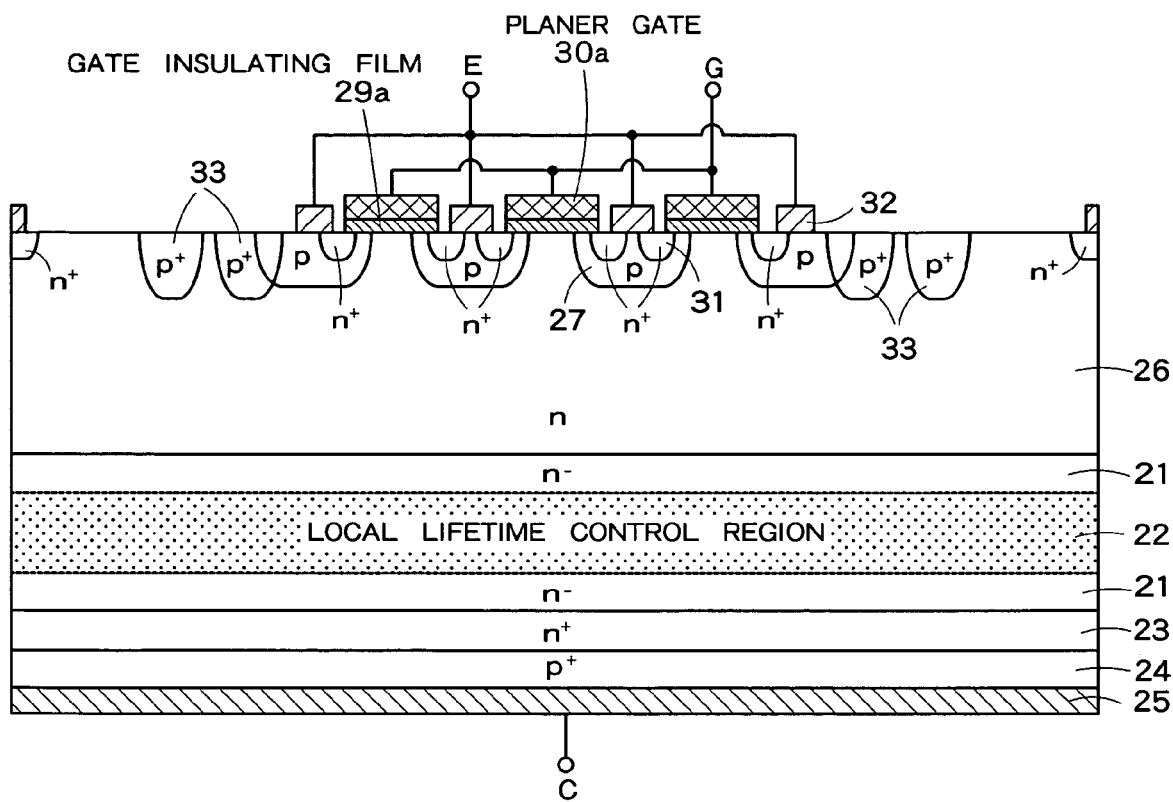
F I G. 14

POWER SEMICONDUCTOR DEVICE

CROSS REFERENCE TO RELATED APPLICATIONS

This application is based upon and claims the benefit of priority from the prior Japanese Patent Application No. 2005-149840, filed on May 23, 2005, the entire contents of which are incorporated herein by reference.

BACKGROUND OF THE INVENTION

1. Field of the Invention

The present invention relates to a power semiconductor device in which measures for power loss is taken.

2. Related Art

With regard to power-rectification diodes used in a power conversion system such as an inverter, it is desirable to reduce a reverse recovery loss, a surge voltage and noise at reverse-recovery operation time switched from a forward bias to a reverse bias. In terms of the reverse recovery loss among the reverse recovery loss, the surge voltage and noise, there has been proposed a technique (refer to Japanese Patent Laid-Open Pub. Nos. 9-264570, 11-26779, and 11-40822) in which a local lifetime control region is formed within the base region to shorten the reverse recovery time.

However, the present inventor has found out that the foregoing conventional techniques include the following problem. In a local lifetime control region, a hole trap level or a deep donor level is formed as a parasitic characteristic. Therefore, when a forward bias is applied to the diode, holes are trapped in the level of this kind. Upon the reverse-recovery operation time when the diode switches from the forward bias to the reverse bias, the gradient of electric-field strength in the diode is enlarged through positive charges of the trapped holes, whereby the avalanche voltage is lowered. Therefore, a voltage between a cathode and an anode is clamped at a voltage lower than a theoretical value, and occurrence of an avalanche current increases an anode current; as a result, the reverse-recovery loss increases.

Power switching devices (such as an IGBT) have the same problem. When the device changes from the ON-state to the OFF-state, an avalanche current may flow, thereby causing a considerable power loss.

SUMMARY OF THE INVENTION

According to one embodiment of the present invention, a power semiconductor device comprising:

a first base layer of first conductive type;

a contact layer of first conductive type formed on a surface of the first base layer;

a second base layer of first conductive layer which is formed on the surface of the first base layer at a side opposite to the first contact layer and has an impurity concentration higher than that of the first base layer a second contact layer of second conductive type formed on the surface of the first base layer or the second base layer; and a junction termination region formed in vicinity of or in contact with outside in a horizontal direction of the second contact layer.

According to one embodiment of the present invention, a power semiconductor device comprising:

a first base layer of first conductive type;

a first contact layer of second conductive type formed on one surface side of the first base layer;

a second base layer of first conductive layer which is formed on a surface at a side opposite to the first contact layer and has an impurity concentration higher than that of the first base layer;

a third base layer of second conductive type formed on the surface of the first base layer or the second base layer;

a second contact layer of first conductive type selectively formed on a surface of the third base layer;

a gate electrode film formed via an insulating film in a trench which reaches the first base layer or the second base layer by passing through the third base layer and the second contact layer; and a junction termination region formed in vicinity of or in contact with outside in a horizontal direction of the third base layer.

According to one embodiment of the present invention, a power semiconductor device comprising:

a first base layer of first conductive type;

a first contact layer of second conductive type formed on one surface side of the first base layer;

a second base layer of first conductive type which is formed on a surface of the first base layer opposite to that of the first contact layer and has an impurity concentration higher than that of the first base layer;

a gate electrode film formed on a surface of the second base layer via an insulating layer;

a third base layer of second conductive type formed in vicinity of the surface in the second base layer;

a second contact layer of first conductive type selectively formed on a surface of the third base layer; and a junction termination region formed in vicinity of or in contact with outside of a horizontal direction of the third base layer.

BRIEF DESCRIPTION OF THE DRAWINGS

FIG. 1 is a cross-sectional view illustrating the cross-sectional structure of a power semiconductor device according to Embodiment 1 of the present invention;

FIG. 2A is a set of charts representing the distribution of the electric-field strength in the diode in FIG. 1;

FIG. 2B is a set of charts representing, for the sake of comparison, the distribution of the electric-field strength in a conventional diode in which, instead of the low-concentration n⁻ type base layer 1, an n type base layer 1a is used;

FIG. 3 is a voltage/current characteristic chart for the diode in FIG. 1;

FIGS. 4A-4C are process cross-sectional views illustrating an example of a manufacturing process for the diode in FIG. 1;

FIGS. 5A-5C are process cross-sectional views following FIG. 4;

FIG. 8 is a cross-sectional view illustrating a cross-sectional structure of a semiconductor device obtained by omitting the local lifetime control region 2 of the semiconductor device in FIG. 1;

FIG. 9 is a cross-sectional view illustrating a cross-sectional structure of a semiconductor device obtained by omitting the local lifetime control region 2 of the semiconductor device in FIG. 6;

FIG. 14 is a cross-sectional view illustrating the cross-sectional structure of a power semiconductor device according to Embodiment 4 of the present invention.

DETAILED DESCRIPTION OF THE INVENTION

Figure 6:
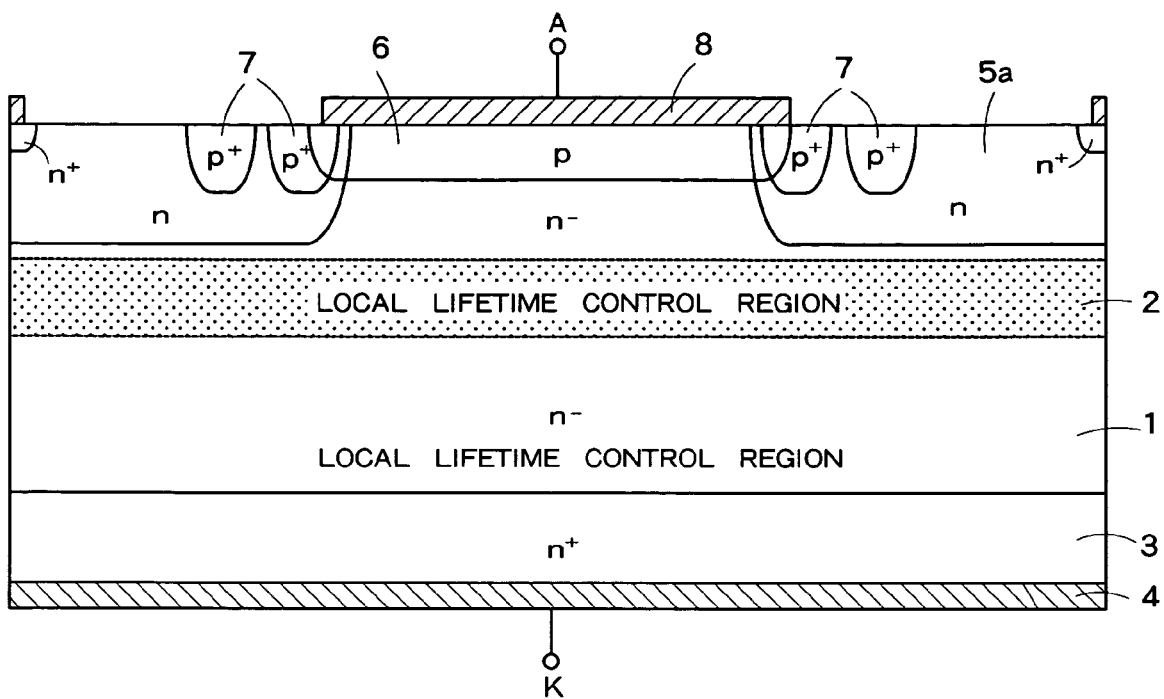
FIG. 6 is a cross-sectional view illustrating the cross-sectional structure of a diode according to Embodiment 2 of the present invention.

An embodiment of the present invention will be explained below, with reference to the accompanying drawings.

Embodiment 1

FIG. 1 is a cross-sectional view illustrating a cross-sectional structure of a power semiconductor device according to Embodiment 1 of the present invention. FIG. 1 shows an example of a diode.

The diode in FIG. 1 includes an $n^-$ type base layer (a first base layer) 1, a local lifetime control region 2 formed within the $n^-$ type base layer 1, an $n^+$ type cathode layer (a first contact layer) 3 formed on the surface of the $n^-$ type base layer 1, a cathode electrode 4 formed on the surface of the cathode layer 3, an n type base layer (a second base layer) 5 formed on the surface of the $n^-$ type base layer 1 at side opposite to the cathode layer 3, a p type anode layer (a second contact layer) 6 formed on the surface of the n type base layer 5, a junction termination region that is formed adjacently to outside in horizontal direction of the anode layer 6 and is composed of $p^+$ type guard ring layers 7, and an anode electrode 8 formed on the surface of the anode layer 6. In addition, the junction termination region is not necessarily composed of the guard ring layers only, but may be composed of, for example, low-concentration p type RESURF layers.

The local lifetime control region 2 is a region in which a recombination center is intentionally provided in order to improve the reverse-recovery properties of the diode. Owing to the recombination center, it is possible to switch the diode from the forward bias to the reverse bias at high speed.

The diode in FIG. 1 is characterized by including the $n^-$ type base layer 1 containing low-concentration impurities. By providing low-concentration $n^-$ type base layer 1, the gradient of the electric-field strength can be reduced in the vertical direction of the diode.

FIG. 2A is a view showing distribution of the electric-field strength of the diode in FIG. 1. FIG. 2B is a view showing distribution of the electric-field strength of the conventional diode using an n type base layer 1a having more concentration than that of the $n^-$ type base layer 1 as a comparison example, instead of the low-concentration $n^-$ type base layer 1. In the case of a diode having the structure illustrated in FIG. 2B, in both the n type base layer 1a and the local lifetime control region 2, the respective field-strength gradients increase in proportion to the quantities of transient positive charges in the n type base layer 1a and the local lifetime control region 2.

In general, when the maximal value of an electric-field reaches the maximal electric field strength of a semiconductor material, an avalanche occurs. It is known that the voltage is equal to an integration value in a depth direction of the electric-field strength. In terms of the voltage (avalanche voltage) at which an avalanche occurs, there is a characteristic in which as the gradient is large in the depth direction of the electric-field strength, the avalanche becomes low. Therefore, in the diode having the structure illustrated in FIG. 2B, the avalanche voltage is lowered, and the avalanche current occurs at the reverse recovery time. As a result, power loss increases and oscillation of the element may easily occur. In particular, when the local lifetime control region 2 is provided, a hole trap level is formed within the local lifetime control region 2, whereby holes are trapped in the hole trap level at the forward conduction time when the diode is forward-biased. Therefore, the gradient of the electric-field strength in the diode may easily become large at the reverse-recovery time, due to remaining positive charges. Accordingly, in the case where the local lifetime control region 2 is provided, adoption of the structure illustrated in FIG. 2B further enlarges the power loss.

In contrast, although, in the case of the diode illustrated in FIGS. 1 and 2A, according to the present embodiment, the gradient of the electric-field strength in the n type base layer 5 is as steep as that in the case of the conventional structure, the electric-field strength changes gradually in the $n^-$ type base layer 1. Accordingly, the lowering of the avalanche voltage is suppressed, whereby the occurrence of the avalanche is prevented. As a result, the current that flows upon the reverse recovery is also reduced. Even if the local lifetime control region 2 is provided, donor impurity concentration in the region 2 is low due to the $n^-$ type base layers 1, thereby suppressing the gradient of the electric-field strength in the local lifetime control region 2. Therefore, according to the present invention, a low-loss diode can be obtained.

FIG. 3 is a voltage/current characteristic chart for the diode in FIG. 1, the abscissa denotes the time (0.2 μs/div) and the ordinate denotes the anode voltage VA (200 V/div) and the anode current IA (50 A/div). FIG. 3 represents an example in which the diode is forward-biased before the timing t1, the reverse-recovery operation starts at the timing t1, and the diode becomes nonconductive (OFF) approximately at the timing t2. The duration from the timing t1 to the timing t2 is the reverse recovery period; a shaded portion in the chart represents a current component which represents a main cause for power loss. As can be seen from the waveform in the chart, the diode according to the present embodiment causes no avalanche at the reverse recovery time. Therefore, good characteristics having small current and reverse-recovery charge are realized.

In contrast, in voltage/current characteristics for the diode in FIG. 2B, it has been confirmed that an avalanche occurs during the reverse recovery period, and the waveform of the current rises or oscillates.

Explaining the above effect from another point of view, if, in the conventional diode in FIG. 2B, the n type base layer 1a is formed in such a way that its concentration is as low as that of the low-concentration $n^-$ type base layer 1 according to the present invention, the width of the depletion layer extending in the horizontal direction of the substrate increases in the unction termination region at OFF state. Therefore, the area of the necessary junction termination region increases. In contrast, in the case of the diode according to the present embodiment shown in FIG. 2A, because the n type base layer 5 having concentration higher than that of the $n^-$ type base layer 1 is provided in the junction termination region, the width of the depletion layer can be suppressed to be as much as that of the conventional structure.

FIGS. 4 and 5 are processing cross-sectional views each illustrating an example of a manufacturing process for the diode in FIG. 1. In the first place, an n⁻ type high-resistance substrate is prepared that is to be used as a material for the n⁻ type base layer 1 (FIG. 4A). Next, by making impurities diffuse within the n⁻ type high-resistance substrate, the n⁺ cathode layer 3 is formed (FIG. 4B). Alternatively, a substrate having an n⁺ epitaxial layer on the surface of an n⁻ type substrate may be provided in advance.

Thereafter, on the surface of the n⁻ type base layer 1, the middle-concentration n type base layer 5 is formed through ion implantation and diffusion processing, or epitaxial growth (FIG. 4C). Alternatively, a substrate having an n⁺ type cathode layer 3 formed on one surface by sandwiching the an n⁻ type substrate and n type epitaxial layer 5 formed on the other surface is prepared in advance.

Next, the junction termination layer 7 and the p type anode layer 6 are sequentially formed, through impurity-ion implantation and diffusion processing (FIG. 5A).

Thereafter, an insulating film 9 is formed on the surface of the junction termination region, through thermal oxidation or film growth. Subsequently, through deposition or spattering, the anode electrode 8 to be connected to the p type anode layer 6 and the cathode electrode 4 to be connected to the n⁺ cathode layer 3 are formed (FIG. 5B).

Next, after a charged particle beam of proton, helium, or the like is irradiated onto the cathode electrode 4 or the anode electrode 8, annealing processing is applied to the device to form the local lifetime control region 2 (FIG. 5C) in the n⁻ type base layer 1. As a result, a diode having the structure illustrated in FIG. 1 is completed.

As described above, according to Embodiment 1, the local lifetime control region 2 is formed in the low-concentration n⁻ type base layer 1. Therefore, the gradient of the electric-field strength in the diode can be reduced, thereby reducing the avalanche current that flows at the reverse recovery time and reducing power loss.

Embodiment 2

In Embodiment 1, the n⁻ type base layer 1 is provided to reduce the gradient of the electric-field strength. However, because the middle-concentration n type base layer 5 exists immediately beneath the p type anode layer 6, the gradient of the electric-field strength is enlarged at the junction portion between the middle-concentration n type base layer 5 and the p type anode layer 6. In this regard, in Embodiment 2, a middle-concentration n type base layer 5a is formed only in a region necessary for suppressing spread in the horizontal direction of the depletion layer, i.e., only in the junction termination region. Therefore, it is possible to reduce the gradient of the electric-field strength in the vertical direction, and to reduce spread of the depletion layer in the horizontal direction, thereby downsizing the device.

FIG. 6 is a cross-sectional view illustrating the cross-sectional structure of a diode according to Embodiment 2 of the present invention. In FIG. 6, the same constituent components as those in FIG. 1 are designated by the same reference characters. Hereinafter, differences from that of FIG. 1 will mainly be explained below.

In the diode in FIG. 6, the n type base layer 5a is formed in a region different from that in FIG. 1. The n type base layer 5a in FIG. 6 is formed in the vicinity of and outside the p type anode layer 6, i.e., in the junction termination region. The n type base layer 5a prevents the depletion layer from spreading horizontally. The n⁻ type base layer 1 and the p type anode layer 6 are arranged adjacent to each other.

Figures 7A, 7B:
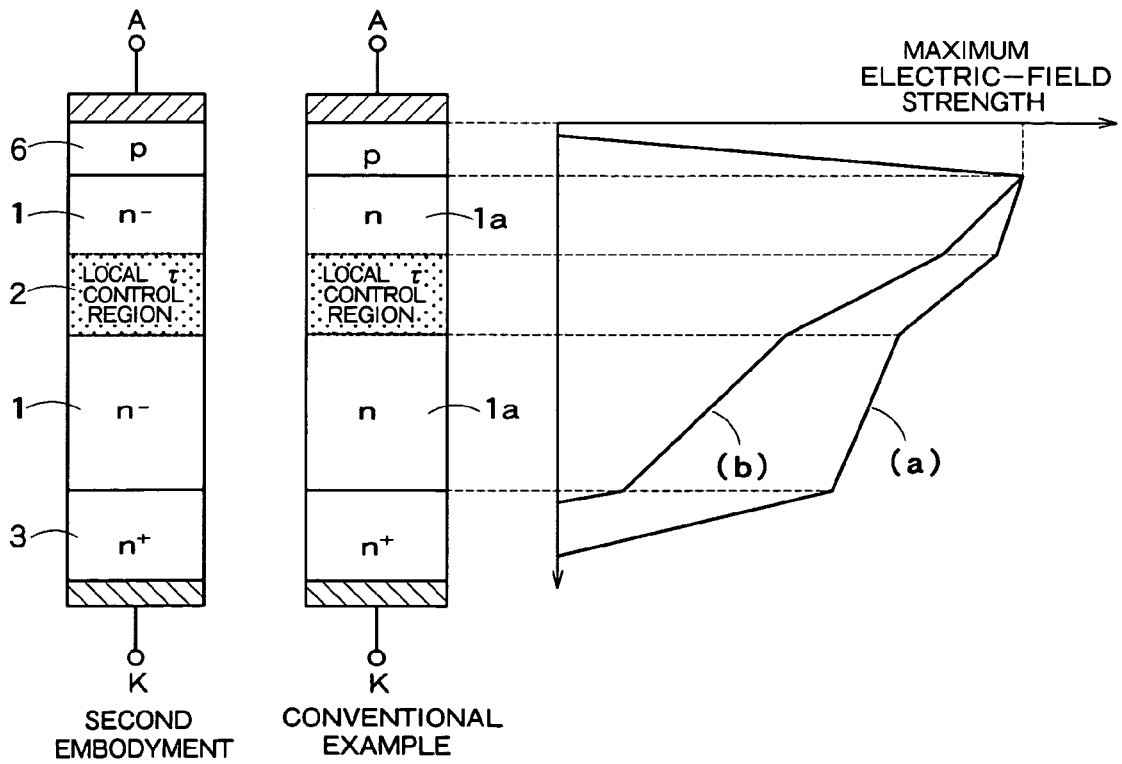
FIGS. 7A-7B are charts representing the distribution of the electric-field strength in the diode in FIG. 6.

FIG. 7 is a view representing the distribution of the electric-field strength in the diode in FIG. 6. The middle-concentration n type base layer 5 does not exist between the anode electrode 8 and the cathode electrode 4, whereby the electric-field gradient characteristic is different from that represented in FIG. 2. In FIG. 7, the n⁻ type base layers 1 is arranged at both sides of the local lifetime control region 2, and middle-concentration n type base layer is not arranged immediately beneath the p type anode layer 6. Therefore, the gradient of the electric-field strength is further more reduced than that of the first embodiment, thereby reducing power loss.

As discussed above, according to embodiment 2, the middle-concentration n type base layer is provided only in the junction termination region. Therefore, not only the gradient of the electric field immediately beneath the p type anode layer 6 can be reduced, but also the spread of the depletion layer in the horizontal direction of the substrate can be suppressed. Therefore, even if the impurity concentration of the n⁻ type base layer 1 is low, the junction-termination structure is not affected.

Each of the semiconductor devices shown in FIGS. 1 and 6, described above has the local lifetime control region 2 for improving the reverse-recovery properties of a diode. However, the local lifetime control region 2 is not necessarily an inevitable element.

FIG. 8 is a cross-sectional view illustrating a cross-sectional structure of a semiconductor device obtained by omitting the local lifetime control region 2 of the semiconductor device in FIG. 1; and FIG. 9 is a cross-sectional view illustrating a cross-sectional structure of a semiconductor device obtained by omitting the local lifetime control region 2 of the semiconductor device in FIG. 6.

Also in the semiconductor devices in FIGS. 8 and 9, by providing the low-concentration n⁻ type base layer 1, the gradient of the electric-field strength in the diode can be reduced, whereby a current that flows at the reverse recovery time can be suppressed.

Embodiment 3

A characteristic of Embodiment 3 is to reduce power loss at turn off time in an insulated gate bipolar transistor (IGBT) used as a switching element in a power conversion system such as an inverter.

Figure 10:
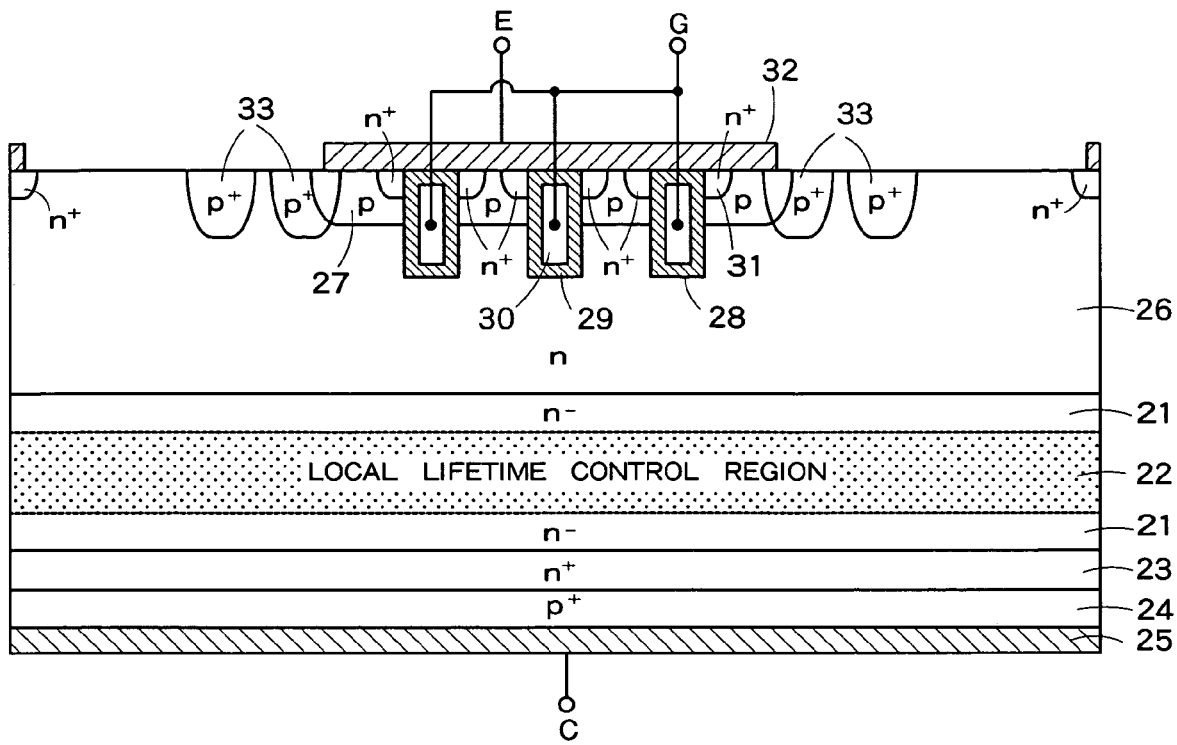
FIG. 10 is a cross-sectional view illustrating the cross-sectional structure of a power semiconductor device according to Embodiment 3 of the present invention.

FIG. 10 is a cross-sectional view illustrating a cross-sectional structure of a power semiconductor device according to Embodiment 3 of the present invention. FIG. 10 shows an example of the IGBT.

The IGBT in FIG. 10 includes an n⁻ type base (drift) layer (a first base layer) 21, a local lifetime control region 22 formed within the n⁻ type base layer 21, an n⁺ type buffer layer 23 formed on the surface of the n⁻ type base layer 21, a p⁺ type collector layer (a first contact layer) 24 formed on the surface of the buffer layer 23, a collector electrode 25 formed on the surface of the collector layer 24, an n type base layer (a second base layer) 26, formed on the surface of the n⁻ type base layer 21, that is opposite to the n⁺ buffer layer 23, with respect to the n⁻ type base layer 21, a p type well region (a third base layer) 27 formed on the surface of the n type base layer 26, a plurality of trenches 28 that are selectively formed in the p type well region 27 and reach the n type base layer 26, insulated gate electrodes 30 each formed by way of an insulating film 29 in the trench, an n⁺ type emitter region (a second contact layer) 31 formed in contact with the trenches 28, an emitter electrode 32 formed so as to be concurrently in contact with the surfaces of the p type well region 27 and the n⁺ itter region 31, and a junction termination region formed of a guard ring layer 33 formed around the p type well region 27.

Because, also in the IGBT in FIG. 10, the low-concentration n⁻ type base layer 21 is provided on both sides of the local lifetime control region 22, the gradient of the electric-field strength can be reduced. Therefore, an avalanche current upon the turn-off operation in which the state of the device changes from the ON state to the OFF state can be suppressed, whereby power loss can be reduced.

Figure 11:
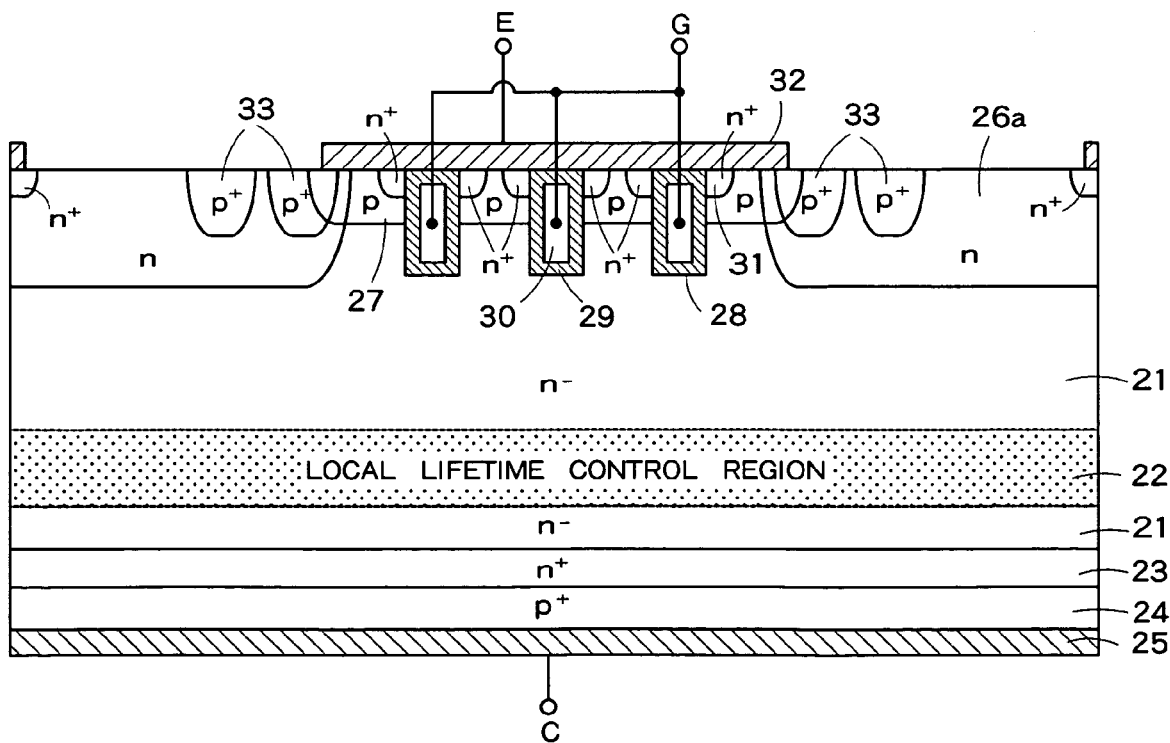
FIG. 11 is a cross-sectional view illustrating a variant example of the power semiconductor device in FIG. 10.

The IGBT in FIG. 11 is a variant example of the IGBT in FIG. 10. As is the case with the diode in FIG. 6, an n type base layer 26a is formed beneath the junction termination region.

Because, in the IGBT in FIG. 11, the n type base layer 26a is formed only beneath the junction termination region, not only the gradient of the electric field immediately beneath the p type well region 27 can be reduced, but also the spread of the depletion layer in the horizontal direction can be reduced. Therefore, even if the impurity concentration of the n⁻ type base layer 1 is low, the junction-termination structure is not affected. The IGBTs in FIGS. 10 and 11 each have the local lifetime control region 22. However, the region may be omitted.

Figure 12:
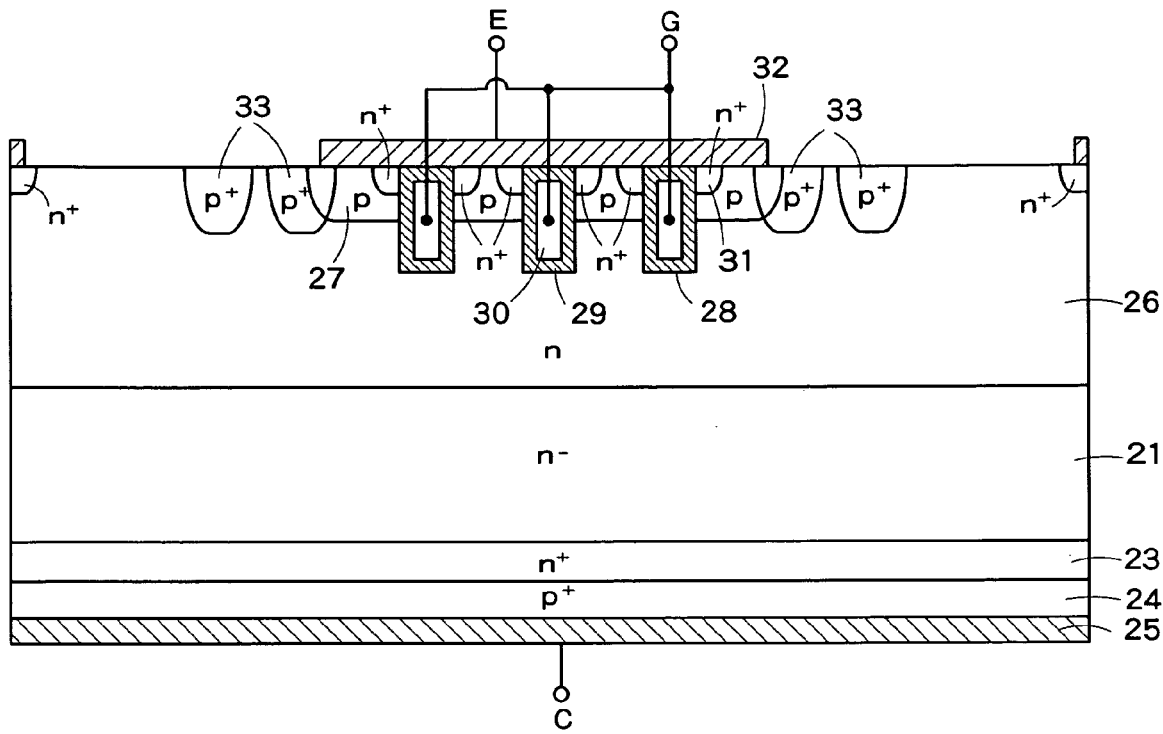
FIG. 12 is a cross-sectional view of an IGBT having a structure obtained by omitting the local lifetime control region 22 of the IGBT in FIG. 10.
Figure 13:
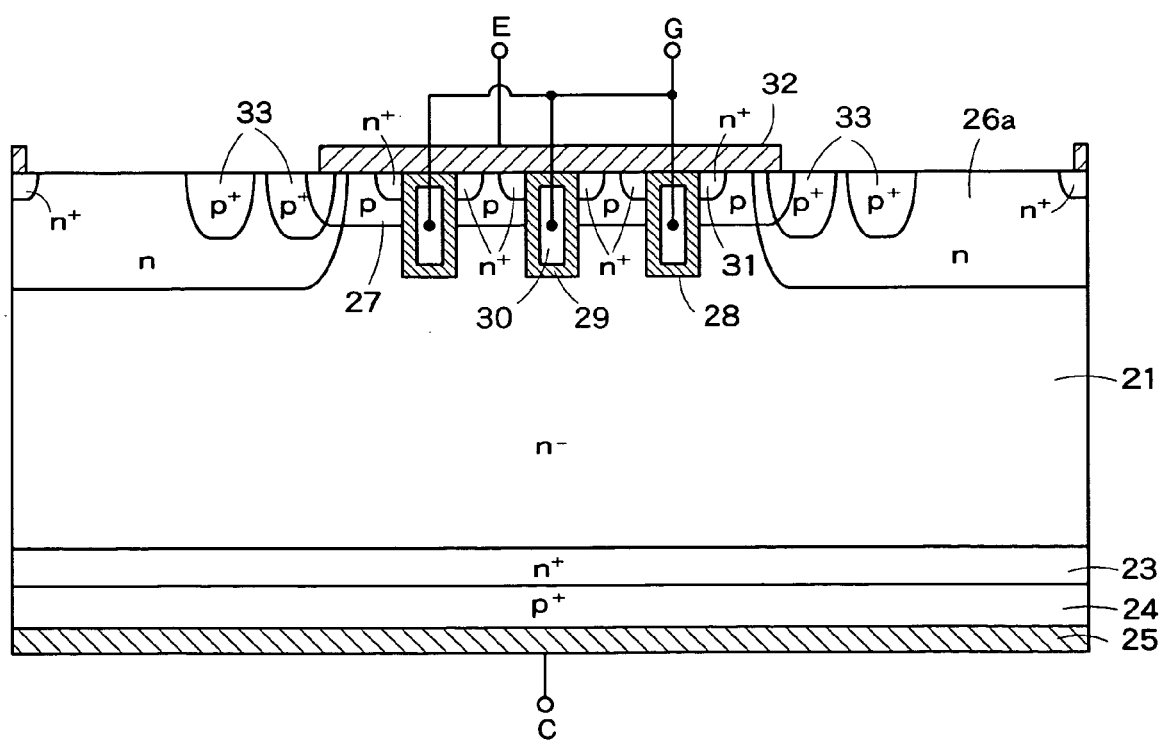
FIG. 13 is a cross-sectional view of an IGBT having a structure obtained by omitting the local lifetime control region 22 of the IGBT in FIG. 11.

FIG. 12 is a cross-sectional view of an IGBT having a structure obtained by omitting the local lifetime control region 22 of the IGBT in FIG. 10. FIG. 13 is a cross-sectional view of an IGBT obtained by omitting the local lifetime control region 22 of the IGBT in FIG. 11.

Even in the IGBTs in FIGS. 12 and 13, by providing the n⁻ type base layer 21, the gradient of the electric-field strength can be reduced, thereby decreasing an avalanche current that flows at the turnoff time.

Embodiment 4

In Embodiment 3, the structure of an insulated gate type IGBT using trenches has been explained. However, the present invention can be applied to the structure for a planar-type IGBT.

FIG. 14 is a cross-sectional view illustrating the cross-sectional structure of a power semiconductor device according to Embodiment 4 of the present invention. In FIG. 14, the same constituent components as those in FIG. 10 are designated by the same reference characters. Hereinafter, differences from FIG. 10 will mainly be explained below.

A planar-type IGBT in FIG. 14 differs from the IGBT in FIG. 10 in the structure of the portion upper than the n type base layer 26. On the n type base layer 26, a plurality of gate insulating films 29a is formed that are each arranged spaced apart from one another. On the gate insulating films 29a, respective planar gates 30a are formed. An emitter electrode 32 is arranged between the neighboring gate insulating films 29a.

In the n type base layer 26 beneath the gate insulating films 29a and the emitter electrodes 32, p type well regions 27 and n⁺ type emitter regions 31 formed within the corresponding p type well regions 27 are provided. A junction termination region formed of a guard ring layer 33 is provided around the outmost p type well region 27.

Even in the IGBT in FIG. 14, the low-concentration n⁻ type base layer 21 is provided on both sides of the local lifetime control region 22, the gradient of the electric-field strength can be reduced. Therefore, an avalanche current upon the turn-off operation in which the state of the device changes from the ON state to the OFF state can be reduced, thereby reducing power loss.

In addition, as an variant example of the IGBT in FIG. 14, a layer corresponding to the n type base layer 26 may be formed, as illustrated in FIG. 11, only beneath the junction termination region. Alternatively, as illustrated in FIGS. 12 and 13, the local lifetime control region 22 may be omitted.

Other Embodiment

The present invention can be applied to other semiconductor devices than the diodes and the IGBTs described above. For example, by making the base layer of a MOSFET low-concentration, the gradient of the electric-field strength in the base layer can be reduced, whereby the same effect can be obtained.

What is claimed is:

1. A power semiconductor device performing a bipolar operation comprising:
   a first base layer of first conductivity type;
   a first contact layer of first conductivity type formed on a surface of the first base layer;
   a second base layer of first conductivity type which is formed on the surface of the first base layer at a side opposite to the first contact layer and has an impurity concentration higher than that of the first base layer;
   a second contact layer of second conductivity type formed on the surface of the second base layer, the second contact layer forming a pn junction with the second base layer in a depth direction of the first base layer;
   a junction termination region formed in vicinity of or in contact with outside in a horizontal direction of the second contact layer;
   a cathode electrode formed directly on a surface of the first contact layer; and
   an anode electrode formed directly on a surface of the second contact layer.

2. The power semiconductor device according to claim 1, wherein the second base layer is selectively formed on the surface of the first base layer in vicinity of or in contact with the second contact layer.

3. The power semiconductor device according to claim 1, further comprising:
   a local lifetime control region formed in the first base layer.

4. The power semiconductor device according to claim 3, wherein the first base layer is formed at both ends by sandwiching the local lifetime control region.

5. A power semiconductor device performing a bipolar operation comprising:
   a first base layer of first conductivity type;
   a first contact layer of second conductivity type formed on one surface side of the first base layer;
   a second base layer of first conductivity type which is formed on a surface at a side opposite to the first contact layer and has an impurity concentration higher than that of the first base layer;
   a third base layer of second conductivity type formed on the surface of the second base layer, the third base layer forming a pn junction with the second base layer in a depth direction of the first base layer;
   a second contact layer of first conductivity type selectively formed on a surface of the third base layer;
   a gate electrode film formed via an insulating film in a trench which reaches the second base layer by passing through the third base layer and the second contact layer; and
   a junction termination region formed in vicinity of or in contact with outside in a horizontal direction of the third base layer,
   wherein the first base layer and the second base layer extend from inside to outside of the junction termination region.

6. The power semiconductor device according to claim 5, wherein the second base layer is selectively formed on the surface of the first base layer in vicinity of or in contact with the third base layer.

7. The power semiconductor device according to claim 5, further comprising:
a local lifetime control region formed in the first base layer.

8. The power semiconductor device according to claim 7, wherein the first base layer is formed at both ends by sandwiching the local lifetime control region.

9. The power semiconductor device according to claim 5, wherein a plurality of trenches are formed separately from each other, and
a plurality of gate electrodes are formed in the respective trenches.

10. The power semiconductor device according to claim 5, further comprising:
a collector electrode formed on a surface of the first contact layer; and
an emitter electrode formed on a surface of the second contact layer.

11. A power semiconductor device performing a bipolar operation comprising:
a first base layer of first conductivity type;
a first contact layer of second conductivity type formed on one surface side of the first base layer;
a second base layer of first conductivity type which is formed on a surface of the first base layer opposite to that of the first contact layer and has an impurity concentration higher than that of the first base layer;
a plurality of third base layers of second conductivity type formed on the surface in the second base layer, each of the third base layers forming a pn junction with the second base layer in a depth direction of the first base layer;
a gate electrode film formed on a surface of the second base layer and the third base layers via an insulating layer;
a second contact layer of first conductivity type selectively formed on a surface of the plurality of third base layers; and
a junction termination region formed in vicinity of or in contact with outside of a horizontal direction of the plurality of third base layers,
wherein the first base layer and the second base layer extend from inside to outside of the junction termination region.

12. The power semiconductor device according to claim 11, wherein the second base layer is selectively formed on the surface of the first base layer in vicinity of or in contact with the plurality of third base layers.

13. The power semiconductor device according to claim 11, further comprising:
a local lifetime control region formed in the first base layer.

14. The power semiconductor device according to claim 13, wherein the first base layer is formed at both ends by sandwiching the local lifetime control region.

15. The power semiconductor device according to claim 11, wherein a plurality of gate oxide films are formed separately from each other, and
a plurality of gate electrodes are formed in each respective gate oxide film.

16. The power semiconductor device according to claim 11, further comprising:
a collector electrode formed on a surface of the first contact layer; and
an emitter electrode formed on a surface of the second contact layer.

17. A power semiconductor device comprising:
a first base layer of first conductivity type;
a first contact layer of first conductivity type formed on a surface of the first base layer;
a second base layer of first conductivity layer which is formed on the surface of the first base layer at a side opposite to the first contact layer and has an impurity concentration higher than that of the first base layer;
a second contact layer of second conductivity type formed on the surface of the second base layer, the second contact layer forming a pn junction with the second base layer in a depth direction of the first base layer; and
a junction termination region formed in vicinity of or in contact with outside in a horizontal direction of the second contact layer,
wherein the second base layer is formed only in an outside direction from a surrounding area of the junction termination region.

18. The power semiconductor device according to claim 17, further comprising:
a local lifetime control region formed in the first base layer.

19. The power semiconductor device according to claim 18, wherein the first base layer is formed at both ends by sandwiching the local lifetime control region.

20. The power semiconductor device according to claim 18, further comprising:
a cathode electrode formed on a surface of the first contact layer; and
an anode electrode formed on a surface of the second contact layer.

21. A power semiconductor device comprising:
a first base layer of first conductivity type;
a first contact layer of second conductivity type formed on one surface side of the first base layer;
a second base layer of first conductivity layer which is formed on a surface at a side opposite to the first contact layer and has an impurity concentration higher than that of the first base layer;
a third base layer of second conductivity type formed on the surface of the second base layer, the third base layer forming a pn junction with the second base layer in a depth direction of the first base layer;
a second contact layer of first conductivity type selectively formed on a surface of the third base layer;
a gate electrode film formed via an insulating film in a trench which reaches the second base layer by passing through the third base layer and the second contact layer; and
a junction termination region formed in vicinity of or in contact with outside in a horizontal direction of the third base layer,
wherein the second base layer is formed only in an outside direction from a surrounding area of the junction termination region.

22. The power semiconductor device according to claim 21, further comprising:
a local lifetime control region formed in the first base layer.

23. The power semiconductor device according to claim 22, wherein the first base layer is formed at both ends by sandwiching the local lifetime control region.

24. The power semiconductor device according to claim 21, further comprising:
- a cathode electrode formed on a surface of the first contact layer; and
- an anode electrode formed on a surface of the second contact layer.

25. A power semiconductor device comprising:
- a first base layer of first conductivity type;
- a first contact layer of second conductivity type formed on one surface side of the first base layer;
- a second base layer of first conductivity type which is formed on a surface of the first base layer opposite to that of the first contact layer and has an impurity concentration higher than that of the first base layer;
- a plurality of third base layers of second conductivity type formed on the surface in the second base layer, each of the third base layers forming a pn junction with the second base layer in a depth direction of the first base layer;
- a gate electrode film formed on a surface of the second base layer and the third base layers via an insulating layer;
- a second contact layer of first conductivity type selectively formed on a surface of the third base layer; and
- a junction termination region formed in vicinity of or in contact with outside of a horizontal direction of the plurality of third base layers,
- wherein the second base layer is formed only in an outside direction from a surrounding area of the junction termination region.

26. The power semiconductor device according to claim 25, further comprising:
- a local lifetime control region formed in the first base layer.

27. The power semiconductor device according to claim 26,
- wherein the first base layer is formed at both ends by sandwiching the local lifetime control region.

28. The power semiconductor device according to claim 25, further comprising:
- a cathode electrode formed on a surface of the first contact layer; and
- an anode electrode formed on a surface of the second contact layer.

* * * * *